(12) United States Patent
Webb et al.

(10) Patent No.: US 8,197,662 B1
(45) Date of Patent: *Jun. 12, 2012

(54) DEPOSIT MORPHOLOGY OF ELECTROPLATED COPPER

(75) Inventors: Eric Webb, Tigard, OR (US); Jonathan D. Reid, Sherwood, OR (US); Yuichi Takada, Tualatin, OR (US); Timothy Archer, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 12/971,367

(22) Filed: Dec. 17, 2010

Related U.S. Application Data

(63) Continuation of application No. 10/741,048, filed on Dec. 18, 2003, now Pat. No. 7,879,218.

(51) Int. Cl.
C25D 5/34 (2006.01)
(52) U.S. Cl. ........................................ 205/210; 205/118
(58) Field of Classification Search .................. 205/118, 205/205, 210
See application file for complete search history.

(56) References Cited

U.S. PATENT DOCUMENTS

| | | |
|---|---|---|
| 6,197,181 B1 | 3/2001 | Chen |
| 6,319,384 B1 | 11/2001 | Taylor et al. |
| 6,432,821 B1 | 8/2002 | Dubin et al. |
| 6,610,192 B1 | 8/2003 | Step et al. |
| 6,638,411 B1 | 10/2003 | Mishima et al. |
| 6,699,380 B1 | 3/2004 | Chen et al. |
| 6,764,952 B1 | 7/2004 | Yu et al. |
| 6,849,122 B1 | 2/2005 | Fair |
| 2001/0013473 A1 | 8/2001 | Taylor |
| 2001/0015321 A1 | 8/2001 | Reid et al. |
| 2002/0195352 A1 | 12/2002 | Mayer et al. |
| 2003/0036280 A1 | 2/2003 | Jain et al. |
| 2004/0000488 A1 | 1/2004 | Yang |
| 2004/0142557 A1 | 7/2004 | Levy et al. |
| 2004/0226827 A1 | 11/2004 | Matsuda et al. |

OTHER PUBLICATIONS

US Office Action dated Oct. 18, 2005 issued in U.S. Appl. No. 10/741,048.
US Office Action dated Mar. 9, 2006 issued in U.S. Appl. No. 10/741,048.
US Office Action dated Mar. 17, 2006 issued in U.S. Appl. No. 10/741,048.
US Office Action Final dated Jul. 18, 2006 issued in U.S. Appl. No. 10/741,048.
US Office Action dated Nov. 27, 2006 issued in U.S. Appl. No. 10/741,048.
US Office Action Final dated Apr. 24, 2007 issued in U.S. Appl. No. 10/741,048.
US Office Action dated Aug. 9, 2007 issued in U.S. Appl. No. 10/741,048.
US Office Action Final dated Dec. 14, 2007 issued in U.S. Appl. No. 10/741,048.
US Notice of Allowance dated Sep. 23, 2010 issued in U.S. Appl. No. 10/741,048.
Examiner's Answer Before the Board of Patent Appeals and Interferences, dated Jun. 18, 2008, issued in U.S. Appl. No. 10/741,048.
Examiner's Answer Before the Board of Patent Appeals and Interferences, dated Sep. 17, 2010, issued in U.S. Appl. No. 10/741,048.

*Primary Examiner* — Luan Van
(74) *Attorney, Agent, or Firm* — Weaver Austin Villeneuve & Sampson LLP

(57) ABSTRACT

The present invention provides improved methods and devices for electroplating copper on a wafer. Some implementations of the present invention involve the pre-treatment of the wafer with a solution containing accelerator molecules. Preferably, the bath into which the wafer is subsequently placed for electroplating has a reduced concentration of accelerator molecules. The pre-treatment causes a reduction in roughness of the electroplated copper surface, particularly during the initial phases of copper growth.

20 Claims, 15 Drawing Sheets

Fill in bath with low acceleration behavior with no pre-treatment. Voids are visible Fill in bath with low acceleration behavior with pre-treatment. No Voids are visible Fill in bath with higher leveler with pre-treatment. No voids are visible.

DEPOSIT MORPHOLOGY OF ELECTROPLATED COPPER

CROSS-REFERENCE TO RELATED APPLICATIONS

This application is a continuation of U.S. patent application Ser. No. 10/741,048 filed on Dec. 18, 2003, titled "Deposit Morphology of Electroplated Copper," by Webb et al., which is incorporated herein by reference in its entirety for all purposes.

TECHNICAL FIELD

This invention relates to the formation of damascene copper interconnects for integrated circuits. The invention more specifically relates to copper surface morphology, particularly during the initial phases of electroplating.

BACKGROUND

To achieve faster operating speeds, integrated circuits (IC's) are being developed with smaller feature sizes and higher densities of components. Conductivity of metal interconnections has emerged as a limitation in the development of these high performance devices. Thus, future generations of IC's will tend to substitute copper for the presently used aluminum conductors.

Forming electrically conducting vias, contacts, and conductors of copper or other metals becomes increasingly challenging as feature sizes are reduced. Techniques for forming such metal features include physical vapor deposition (PVD), chemical vapor deposition (CVD), plasma enhanced chemical vapor deposition (PECVD) and electrochemical deposition (also referred to as electroplating or electrodeposition.)

The general nature of the electroplating process is well known. The wafer is immersed in an electrolytic bath containing metal ions and is biased as the cathode in an electric circuit. With the solution biased positively, the metal ions become current carriers which flow towards and are deposited on the exposed surfaces of the wafer. Electroplating is particularly well suited for the formation of small embedded damascene metal features due to the ability to control (at least in part) the growth of the electroplated film for bottom-up filling and due to the superior electrical conductivity characteristics of the electroplated film. However, there are also several obstacles that need to be overcome in order to realize these advantages fully.

One challenge facing damascene processing techniques is the difficulty of initiating the growth of the metal film within recessed features without forming voids or seams. In typical PVD and some CVD processes, metal may preferentially deposit near the top of recessed features leading to a "bottleneck" shape. Further plating of metal onto the bottleneck may result in sealing the top of the feature before completely filling the feature with metal, creating a void. Voids increase the resistance of the conductor over its designed value due to the absence of the planned-for conductor. Also, trapped electrolyte in sealed voids may corrode the metal. This may lead to degraded device performance or device failure in extreme cases.

Maintaining a smooth copper surface can be particularly challenging during the initial phases of electroplating, as shown in FIGS. 1A through 1F, which are atomic force microscopy ("AFM") images of an electroplated copper layer at increasing thicknesses. FIG. 1A illustrates the smooth seed layer, having a roughness of only 1.68 root mean square ("RMS"), which is a basis of comparison often used in defining surface roughness determined by AFM measurements. After only 140 Å of copper are deposited, the roughness is almost 4 times greater (FIG. 1B). By the time the copper layer reaches 1300 Å in thickness, the roughness has increased to 12.3 RMS (FIG. 1C). As shown in FIGS. 1D through 1F, this roughness tends to decrease as the copper layer grows.

Current technology electroplating baths typically contain three organic additive components in addition to the bulk electrolyte solution. These additives are typically referred to as accelerators, suppressors, and levelers. The combination of accelerator and suppressor in the presence of chloride ions, produces the bottom-up fill effect which allows for filling of recessed trenches and vias. As a result of the accelerated growth within small features, a region of thicker copper exists over the features after plating, commonly referred to as overplating, due to accelerator additives locally concentrated on the copper surface after filling. A high level of overplating can result in CMP dishing or overpolish problems. The leveler additive acts to displace the accumulated accelerator molecule above features, reducing the rate of accelerated growth and thus reducing the overplating, which in turn improve CMP process performance. However, due to the fact that leveler molecules act to displace accelerator molecules, they have a strong impact on the bottom-up fill process when present in high concentration. If the leveler molecule displaces or inhibits adsorption of accelerator molecule prior to fill completion, voids or seams will occur. Therefore, in current electrofill process technology, there exists a trade-off in the leveler concentration in the bath between void-free trench fill at low leveler concentrations and overplating reduction at high leveler concentrations.

Overplating reduction approaches include the use of large slowly diffusing leveling additives and mass transfer conditions which limit leveler diffusion into features, application of reverse currents to displace accelerating additives from the copper surface following the completion of superfilling, plating sequentially in superfilling and highly leveling baths, leveling additives which accumulate on the copper surface and gradually increase leveling activity after superfilling of small features is complete, and relevant to this patent application, pretreatment with accelerator additives followed by plating in high leveling baths. The goal of each of these processes is to maintain the initial very rapid bottom-up plating essential to void-free filling, but to halt the accelerated deposition process over dense features once the filling process is completed.

What is needed is an electroplating technique that produces metal films and features without voids or defects, particularly during the initial phases of the electroplating process, as well as a process that produces a high rate of bottom-up fill within features followed by rapid leveling of the plated copper film.

SUMMARY OF THE INVENTION

The present invention provides improved methods and devices for electroplating metal, particularly copper, on a wafer. Some implementations of the present invention involve the pre-treatment of the wafer with a solution containing accelerator molecules. Preferably, the bath into which the wafer is subsequently placed for electroplating has a reduced concentration of accelerator molecules. The pretreatment causes a reduction in roughness of the electroplated metal surface, particularly during the initial phases of metal growth.

Preferred implementations of the invention involve pretreatment of the wafer surface with accelerating species, followed by plating in a highly leveling bath with little or no accelerator present. Using this approach, the accelerating activity yielding bottom-up fill is derived entirely from the surface coverage of accelerator achieved during pre-treatment, and is most effective during the early stages of plating when small and intermediate size features are filled. As plating proceeds, the leveling characteristics of the bath itself become dominant, thus resulting in elimination of overplating. Without pre-treatment, plating in the highly leveling baths yields conformal growth or slow bottom-up fill which results in center voids in aggressive structures.

Some implementations of the invention provide method of electroplating copper onto a surface comprising a field region and a plurality of recessed features having a range of aspect ratios. The surface has a copper seed layer. The method includes the following steps: contacting the surface with a solution comprising an accelerator additive; immersing the surface in an electroplating solution comprising copper ions, a suppressor additive, an accelerator additive and a leveler additive under conditions wherein the copper seed layer is cathodically polarized with respect to the electroplating solution prior to or less than approximately 5 seconds following the immersing; applying a DC cathodic current density through the surface, the current density having a first value that is sufficiently small that depletion of copper ions and the additives is absent at both the field region and the recessed features, to create a substantially conformal thin conductive metal film on the surface; applying a DC cathodic current density having a second value through the surface, the second value such that electroplating occurs preferentially on bottoms of recessed features having the largest aspect ratios; increasing the current density from the second value until all recessed features have aspect ratios less than about 0.5; and further increasing the current density to a third value that provides a condition of conformal plating, filling said recessed features and plating metal onto the field region.

The copper seed layer may be cathodically polarized by applying a DC cathodic current density of between about 0.02 and about 10 milliamperes per square centimeter. The method may also include the step of superimposing cathodic current pulses (or alternating cathodic and anodic current pulses) on the DC cathodic current density. The current pulses may have current densities of between about 25 and about 250 milliamperes per square centimeter and pulse lengths of between about 0.5 and about 10 milliseconds.

The first value may be between about 0.2 and about 10 milliamperes per square centimeter. The electroplating solution may contain accelerator in a concentration in the range from approximately 0 milliliters per liter to 4 milliliters per liter, and leveler in a concentration in the range of approximately 1 to 7 ppm. The contacting step may involve spraying the surface with the solution comprising the accelerator additive. The second value may be between about 5 and about 15 milliamperes per square centimeter.

The step of increasing the current density from the second value until all recessed features have aspect ratios of less than about 0.5 may involve increasing the current density over a period of between about 3 and about 60 seconds to a maximum current density of between about 4 and about 45 milliamperes per square centimeter. The step of further increasing the current density to a third value that provides a condition of conformal plating may involve further increasing the current density to a value between about 15 and about 75 milliamperes per square centimeter.

Alternative implementations of the invention provide a method of electroplating copper on a substrate. The method includes the following steps: depositing a copper seed layer on the substrate; spraying the copper seed layer with a solution containing accelerator molecules; and electroplating copper on the copper seed layer.

The accelerator molecules may be, for example, any of the following: organic sulfur compounds in different thiol forms having the structure of X—S—S—C—C—C—SO3-; bis(3-sulfopropyl)disulfide, HO3S(CH2)3SS(CH2)3SO3H; 3-mercapto-propanesulphonic acid, HS(CH2)3SO3H; bis(3-sulfoethyl)disulfide, HO3S(CH2)2SS(CH2)2SO3H; 3-(Benzothiazolyl-2-mercapto)-propyl-sulfonic acid; or N,N-Dimethyl-dithiocarbamylpropyl sulfonic acid.

The method may include a drying step after the spraying step and prior to the electroplating step, and may also include at least one rinse step prior to the electroplating step. The rinse step may be prior to and/or after the accelerator pre-treatment step.

The electroplating step may involve immersing the copper seed layer in an electroplating solution containing accelerator in a concentration in the range from approximately 0 milliliters per liter to 4 milliliters per liter and leveler in a concentration in the range of approximately 1 to 7 ppm.

The spraying step may involve spraying the copper seed layer with a solution containing surfactant molecules. The spraying step may also involve spraying the copper seed layer with a solution containing $CuSO_4$. The spraying step can include spraying the copper seed layer with a solution containing components for controlling pH to avoid significant dissolution of the copper seed layer.

Some embodiments of the invention provide a semiconductor device formed at least in part by the following steps: forming a trench in a first dielectric layer; depositing a metal diffusion barrier in the trench; depositing a copper seed layer on the metal diffusion barrier; spraying the copper seed layer with a solution containing accelerator molecules; and forming a copper interconnect on the copper seed layer.

The forming step can involve immersing the copper seed layer in an electroplating solution containing accelerator in a concentration in the range from approximately 0 milliliters per liter to 4 milliliters per liter and/or leveler in a concentration in the range of approximately 1 to 7 ppm.

These and other features and advantages of the present invention will be described in more detail below with reference to the associated drawings.

DETAILED DESCRIPTION

In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to obscure unnecessarily the present invention.

Although the present invention may be used in a variety of applications, one very useful application is the damascene or dual damascene process commonly used in the manufacture of semiconductor devices. The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention.

Dual Damascene Process Flow

Figure 1A:
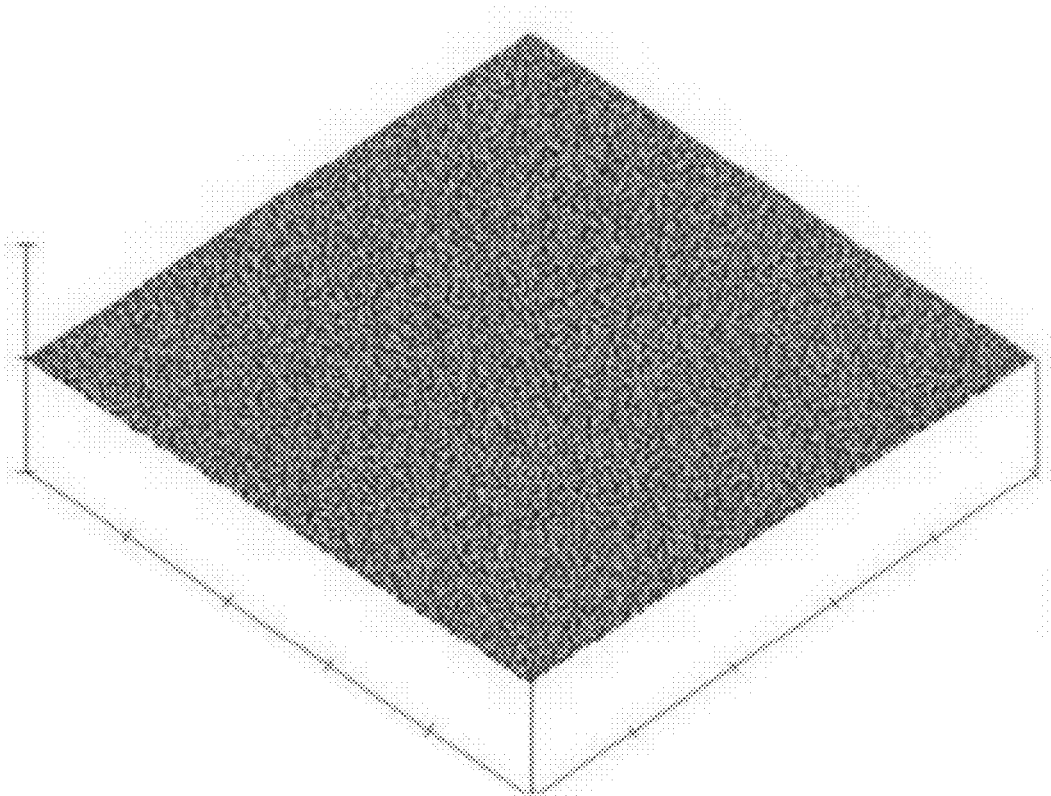
FIGS. 1A through 1F are atomic force microscopy ("AFM") images of an electroplated copper layer at increasing thicknesses.
Figure 1B:
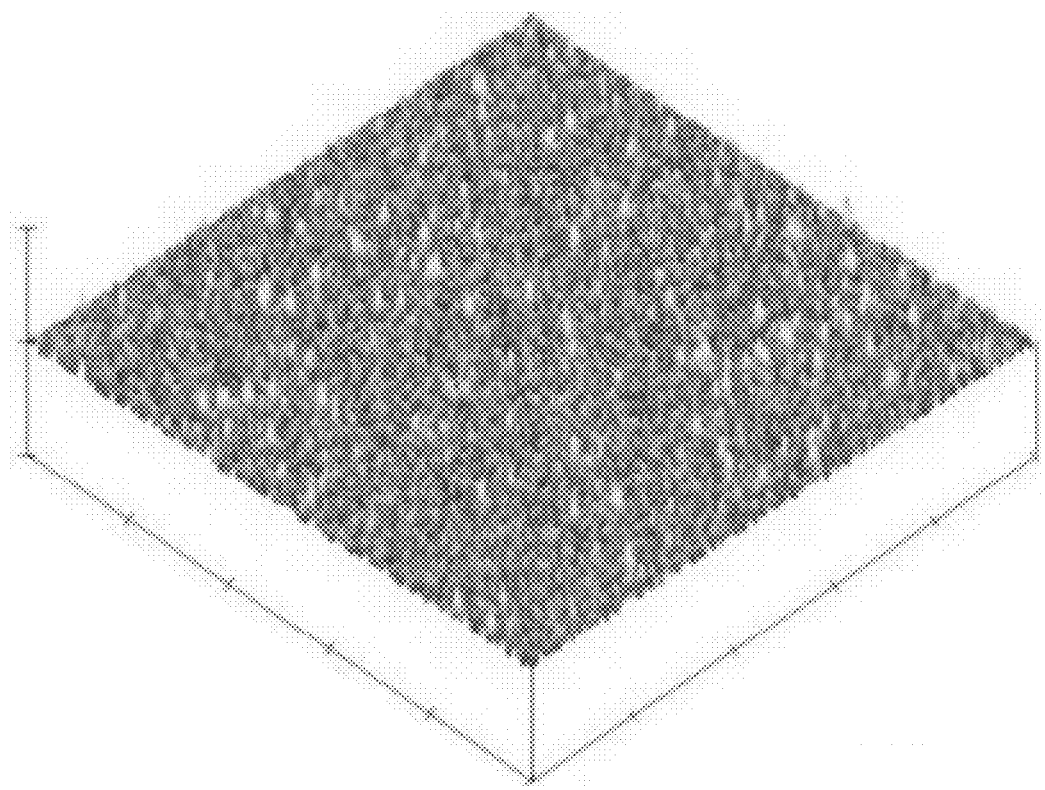
Figure 1C:
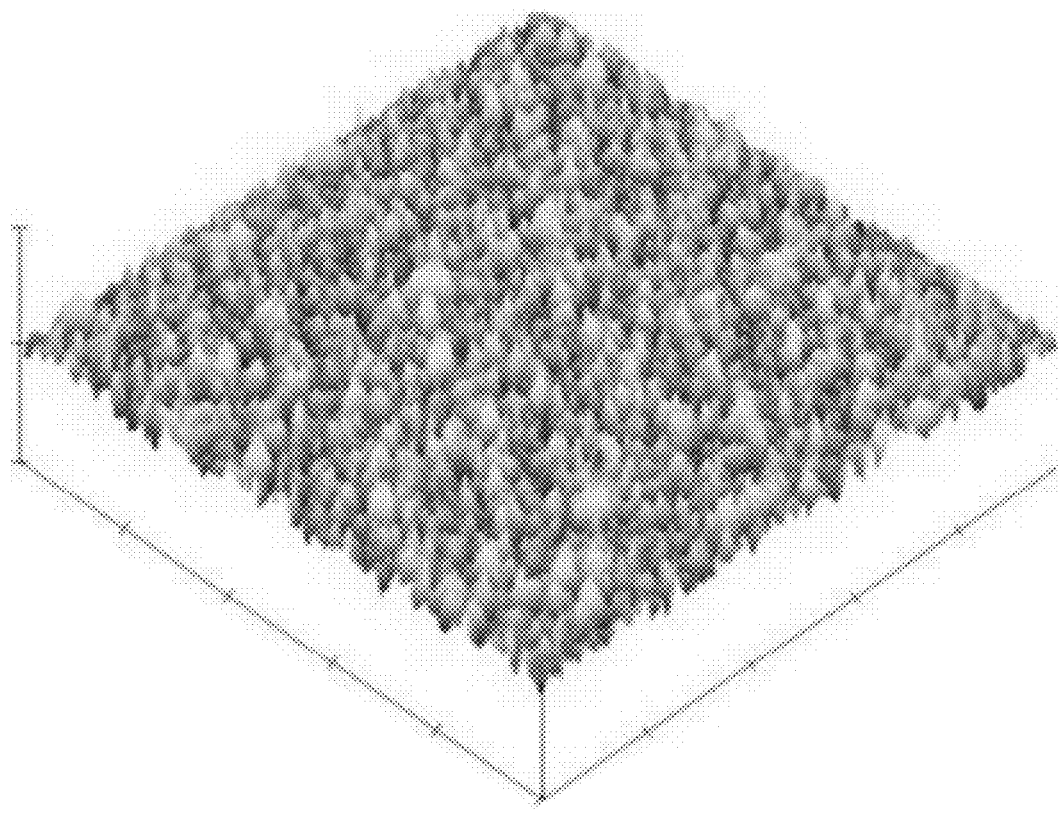
Figure 1D:
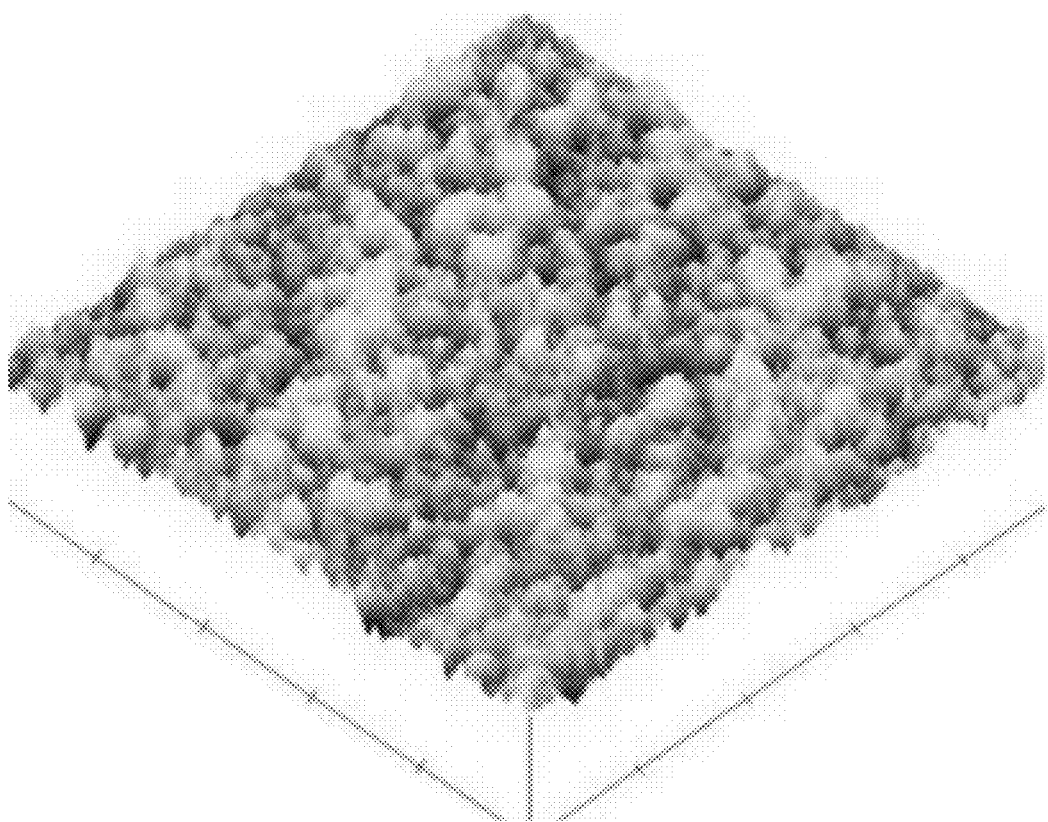
Figure 1E:
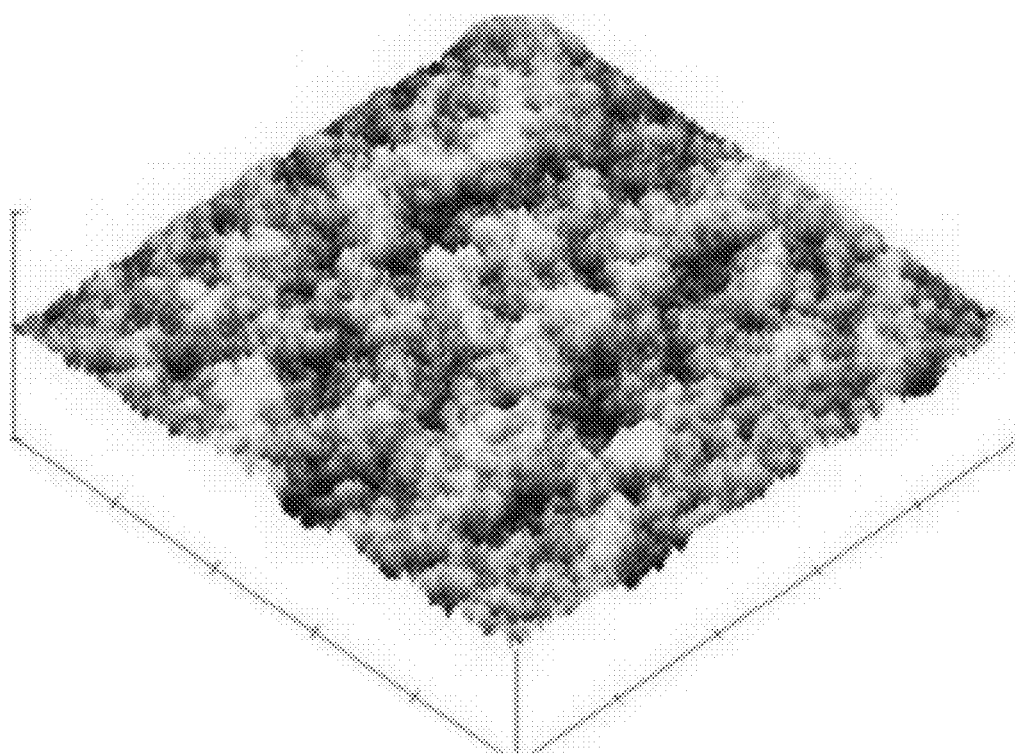
Figure 1F:
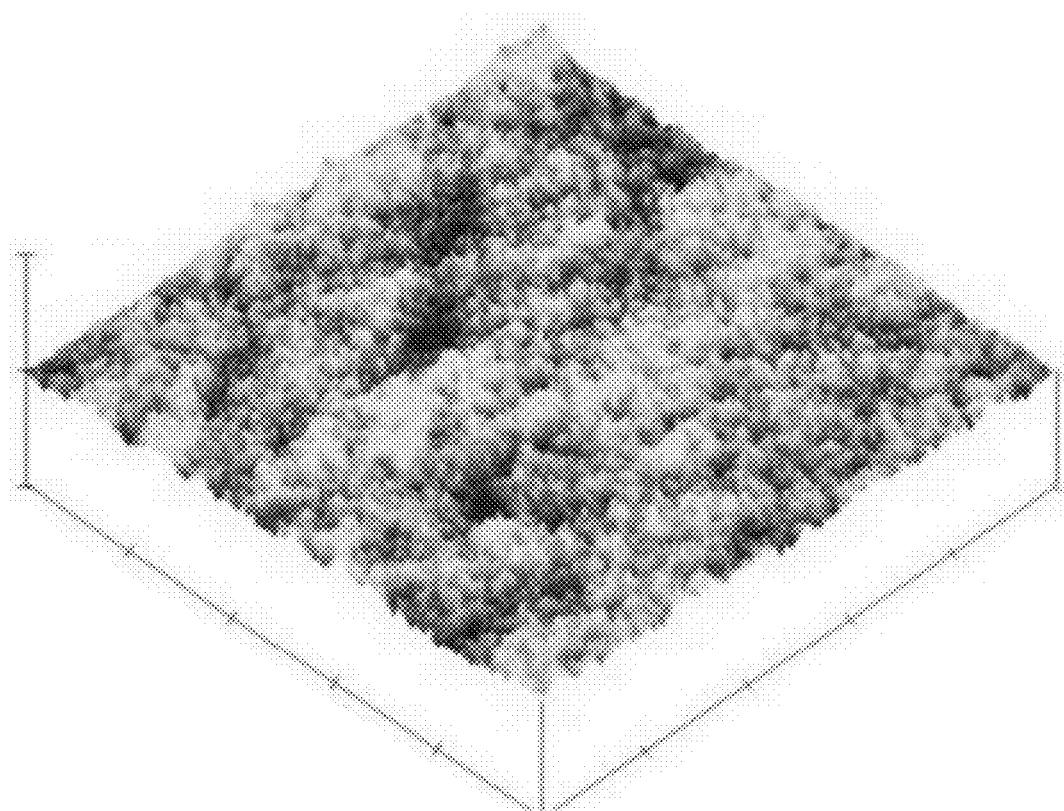
Figure 2A:
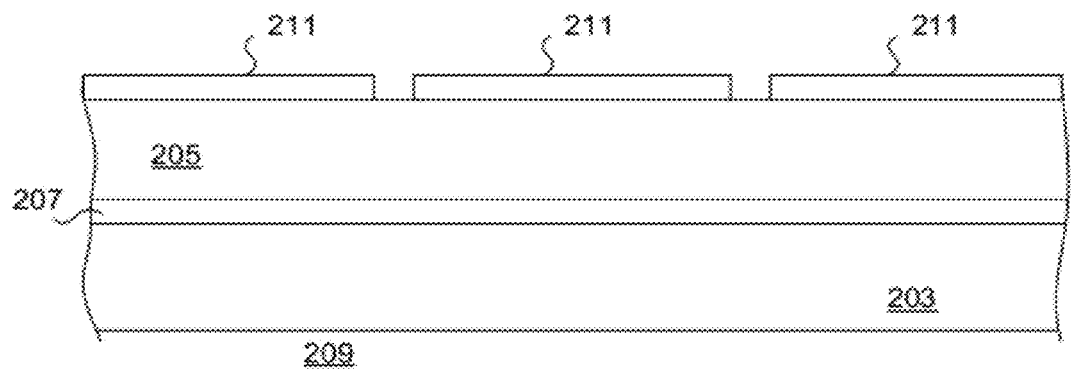
FIG. 2A is a cross sectional diagram of a dielectric layer prior to a via etch in a damascene process.

A generalized version of a dual damascene technique will be described below with reference to FIGS. 2A through 3, which depict a partially formed semiconductor device during various stages of this process.

In a dual damascene process, first and second layers of dielectric are normally deposited in succession, possibly separated by deposition of an etch stop layer such as a silicon nitride layer. These layers are depicted in FIG. 2A as first dielectric layer 203, second dielectric layer 205, and etch stop layer 207. These are formed on an adjacent portion of a substrate 209, which portion may be an underlying metallization layer or a gate electrode layer (at the device level).

Figure 2B:
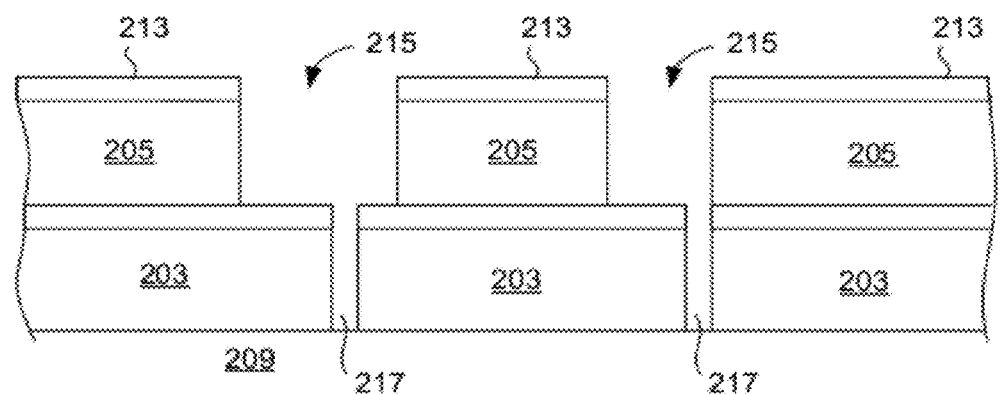
FIG. 2B is a cross sectional diagram of the dielectric layer of FIG. 2A after a line etch has been performed.
Figure 2C:
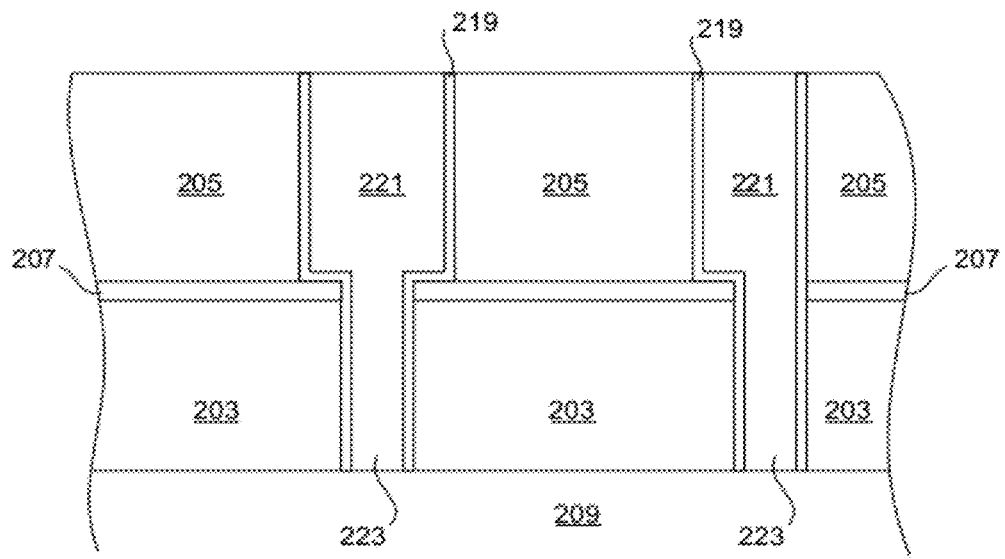
FIG. 2C is a cross sectional diagram of the dielectric layer of FIGS. 2A and 2B after the etched regions have been filled with metal to form lines and vias.
Figure 2D:
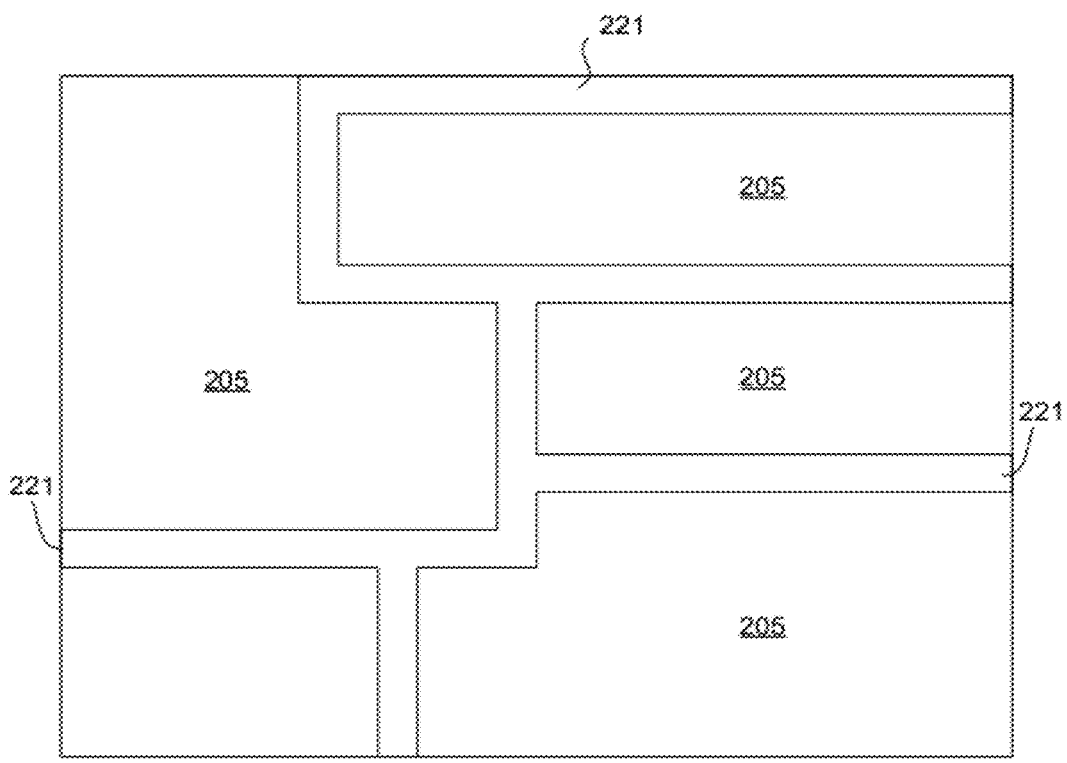
FIG. 2D is a top view of a simplified version of the layer prepared as in FIG. 2C.

After deposition of the second dielectric layer 205, the process forms a via mask 211 having openings where vias will be subsequently etched. Next, the vias are partially etched down through the level of etch stop 207. Then via mask 211 is stripped off and replaced with a line mask 213 as depicted in FIG. 2B. A second etch operation is performed to remove sufficient amounts of dielectric to define line paths 215 in second dielectric layer 205. The etch operation also extends via holes 217 through first dielectric layer 203, down to contact the underlying substrate 209. See FIG. 2B.

Thereafter, the process forms a thin layer of conductive barrier layer material 219 on the exposed surfaces (including sidewalls) of dielectric layers 203 and 205. Conductive barrier layer material 219 may be formed, for example, of tantalum nitride. A CVD or PVD operation is typically employed to deposit conductive barrier layer material 219.

On top of the barrier layer, the process deposits conductive metal (typically copper) in the via holes and line paths 217 and 215. Conventionally this deposition is performed in two steps: an initial deposition of a conductive seed layer followed by bulk deposition of copper by electroplating. However, the present invention provides a pre-treatment step prior to the bulk deposition step, as described in detail below. The seed layer may be deposited by physical vapor deposition, chemical vapor deposition, electroless plating, etc. Note that the bulk deposition of copper not only fills line paths 215 but, to ensure complete filling, covers all the exposed regions on top of second dielectric layer 205.

Thus, it becomes necessary to planarize the structure and remove the excess copper from the device. Planarization removes material down to the level of the top of dielectric layer 205. This results in an exposed pattern of conductive lines 221 in dielectric layer 205 and vias in dielectric layer 203. (See the cross-sectional view of FIG. 2C and the simplified top view of FIG. 2D.)

Planarization may be accomplished by various techniques. Typically, the process involves some amount of chemical mechanical polishing (CMP). It may also involve a combination of electropolishing, to remove most of the excess bulk copper, followed by CMP to remove the remaining copper down to the level of the top surface of dielectric layer 205.

Dielectric layers 203 and 205 are preferably made from a dielectric material that has sufficient mechanical strength to resist damage during CMP or other pressure-based operation. Further, the dielectric material preferably, though not necessarily, has a relatively low intrinsic dielectric constant; e.g., below about 5. Examples include silicon dioxide (4.2), fluorinated silicate glass (3.6-3.7), silicon oxycarbide (2.7-3.1) and the like. Generally, these dielectric layers can be prepared by techniques well known to those of skill in the art such as CVD and spin on techniques.

Figure 2E:
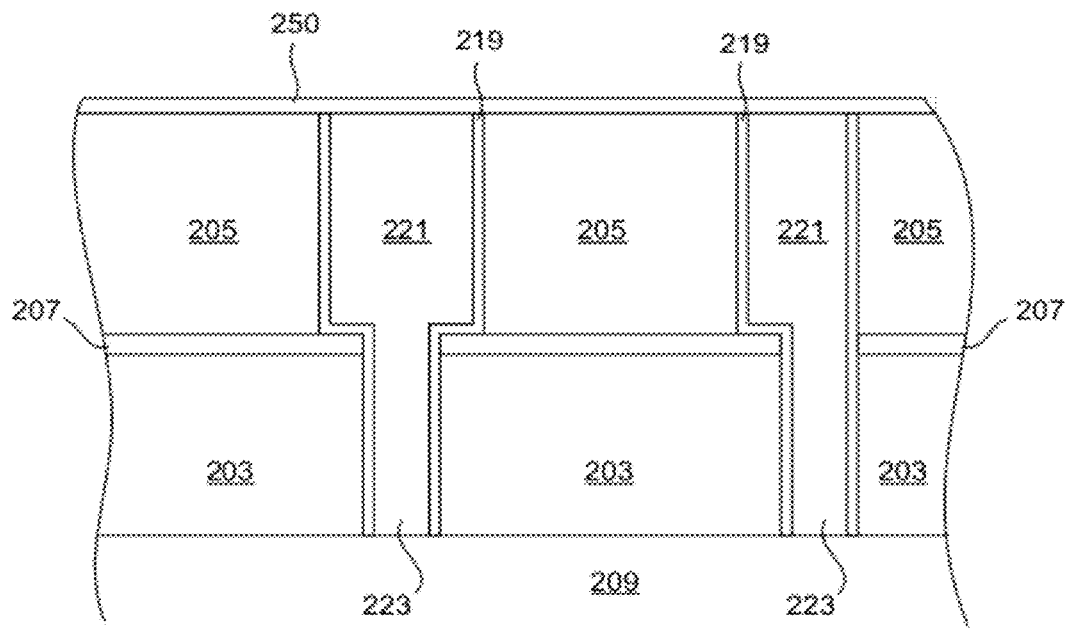
FIG. 2E is a cross sectional diagram of a portion of a semiconductor device including a copper diffusion barrier film.

After removing the excess copper, a copper diffusion barrier is formed, preferably by using a plasma-enhanced chemical vapor deposition technique. Copper diffusion barrier film 250 of FIG. 2E is one such film. Preferably, copper oxide is removed from the copper, e.g., by flowing ammonia gas and/or hydrogen gas with plasma, prior to depositing copper diffusion barrier film 250. Copper diffusion barrier film 250 preferably has a thickness in the range of 100 Å to 1500 Å.

Figure 3:
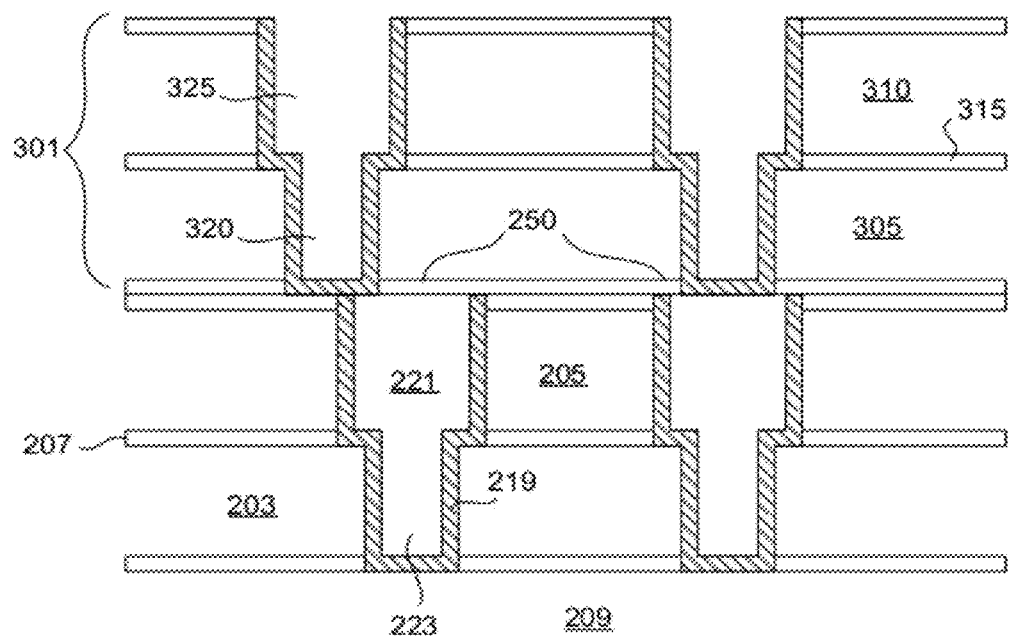
FIG. 3 is a cross sectional diagram of a portion of a semiconductor device formed by a dual damascene process.

FIG. 3 illustrates a partially-formed semiconductor device wherein the foregoing steps have been repeated to form upper layers 301. Dielectric layers 305 and 310 are separated by etch stop layer 315. Upper layers 301 also include vias 320 and lines 325.

Figure 4:
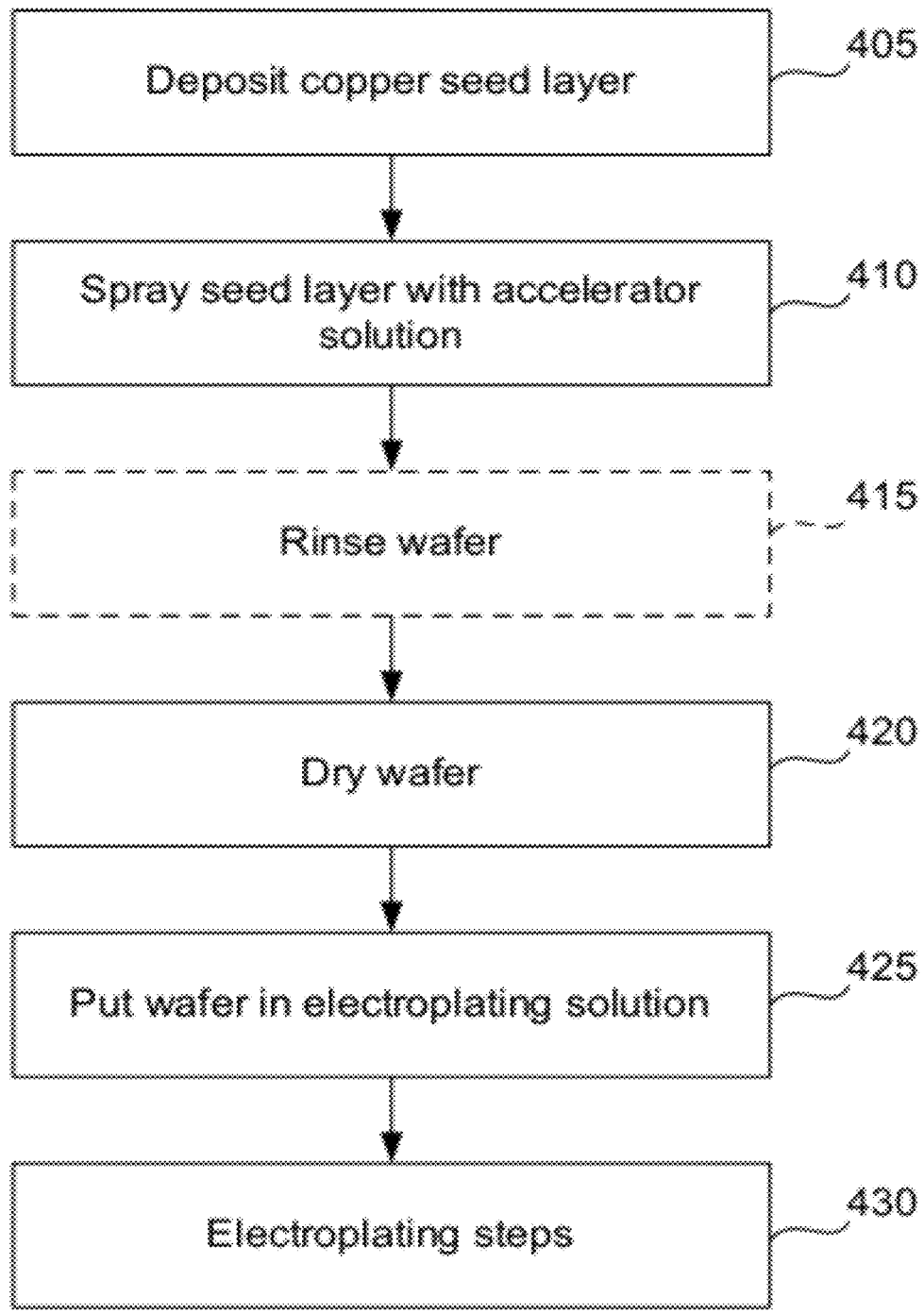
FIG. 4 is a flow chart that outlines a method according to the invention.

FIG. 4 is a flow chart that outlines a method for electroplating copper on a wafer according to some implementations of the invention. In step 405, a copper seed layer is deposited as described above. In step 410, the copper seed layer is "pre-treated" by being placed in contact with an accelerator solution, e.g., by spraying the accelerator solution on the copper seed layer. In some implementations, the accelerator solution is sprayed on the copper seed layer for between 1 and 10 seconds. The accelerator solution may also contain $CuSO_4$ and/or surfactant molecules to aid in wetting the surface of the seed layer. Moreover, the pH of the accelerator solution may be controlled (e.g., within a range of 4-8) with the addition of hydrochloric acid (HCl) or tetramethylammonium hydroxide (TMAH), to allow for adsorption of the accelerator molecules and to avoid significant seed layer dissolution during pre-treatment.

As the name implies, accelerators are additives that increase the rate of a plating reaction. Accelerators are molecules that adsorb on copper surfaces and increase the local current density at a given applied voltage. Accelerators typically contain pendant sulfur atoms, which are understood to participate in the cupric ion reduction reaction and thus strongly influence the nucleation and surface growth of copper films.

Accelerators are generally organic sulfur compounds in different thiol forms with sulfonic acid on one end, for example:

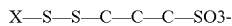

Some accelerator additives are derivatives of mercaptopropanesulfonic acid ("MPS," e.g., 3-mercapto-propanesulphonic acid, HS(CH2)3SO3H). Other accelerator additives are derivatives of dimereaptopropanesulfonic aid ("DPS") or bis(3-sulfopropyl)disulfide, HO3S(CH2)3SS(CH2)3SO3H ("SPS"). Other accelerators include: bis(3-sulfoethyl)disulfide, HO3S(CH2)2SS(CH2)2SO3H; 3-(Benzothiazolyl-2-mercapto)-propyl-sulfonic acid; and N,N-Dimethyl-dithiocarbamylpropyl sulfonic acid.

Some useful accelerators, alternatively termed brighteners, are described, for example, in U.S. Pat. No. 5,252,196 (hereafter '196), incorporated herein by reference. Accelerators are available commercially, for example as Ultrafill A-2001 from Shipley Company (Marlborough, Mass.) or as Viaform Accelerator or SC Primary from Enthone OMI (New Haven, Conn.).

The accelerator solution preferably contains accelerator molecules in a concentration from approximately 1 to 200 parts per million ("ppm"), depending on the type of accelerator used in the solution. For example, preferred concentrations of MPS range from 1 to 10 ppm, whereas preferred concentrations of SPS range from 50 to 200 ppm. However, higher or lower concentrations may also be used.

In optional step 415, the wafer is rinsed. For example, the seed layer may be rinsed with de-ionized water. The rinsing step is preferably limited to a time of, e.g., 1 to 10 seconds, but may take a longer or a shorter time. Step 415 may precede or follow step 410. In some implementations, the wafer is rinsed before and after pre-treatment.

The wafer is then dried (step 420). One convenient method of drying the wafer is to spin the wafer, e.g., for 20 to 40 seconds. After the wafer is dried, it is placed in an electroplating solution (step 425) wherein predetermined electroplating steps are performed (step 430).

Figure 5:
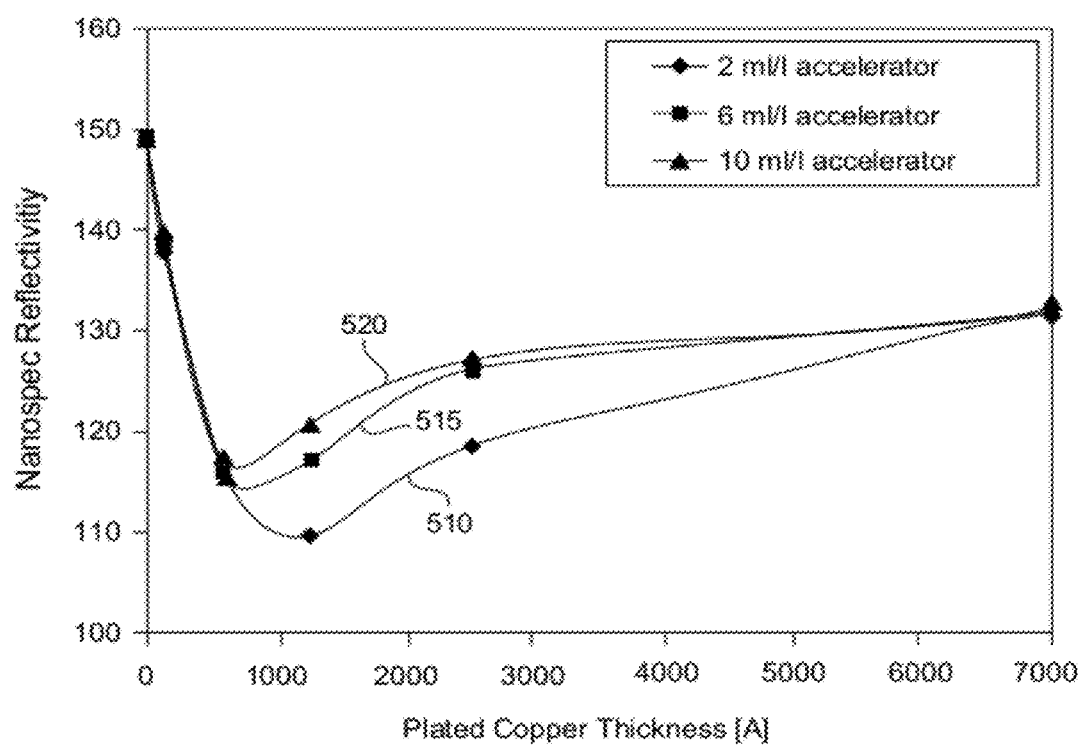
FIG. 5 is a graph of plated copper thickness versus reflectivity for various electroplating conditions.
Figure 6:
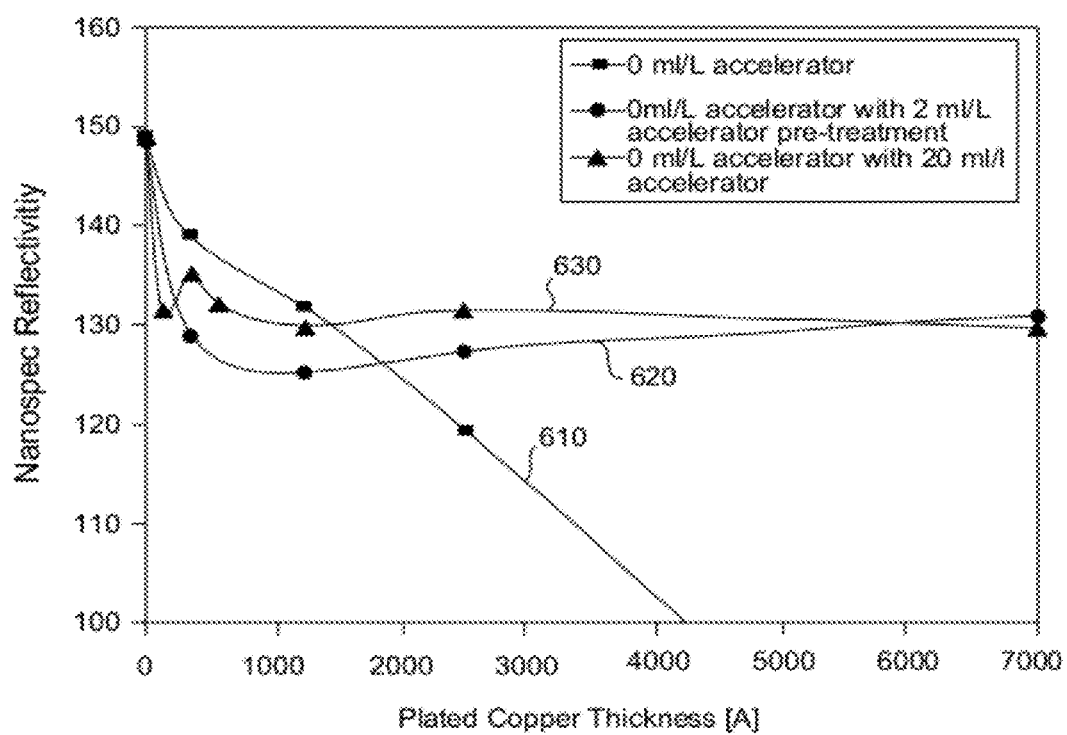
FIG. 6 is a graph of plated copper thickness versus reflectivity for various electroplating conditions.
Figure 7:
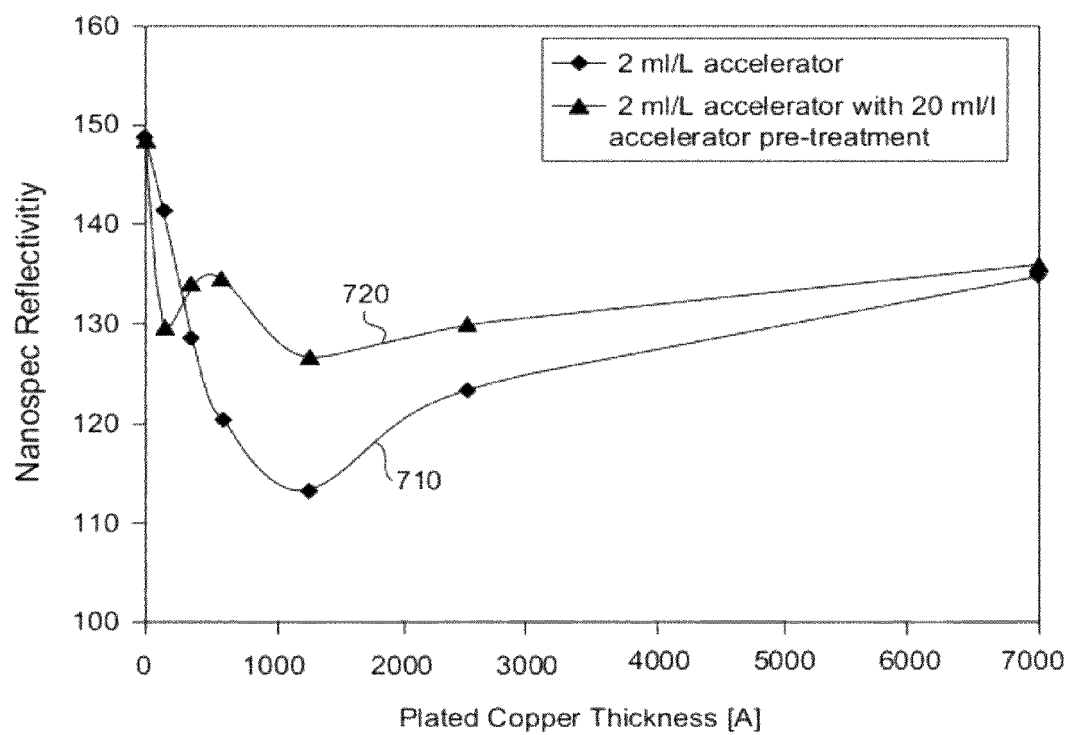
FIG. 7 is a graph of plated copper thickness versus reflectivity for various electroplating conditions.

FIGS. 5 through 7 are graphs of plated copper thickness versus reflectivity that illustrate the effectiveness of some implementations of the invention. As understood by those of skill in the art, a higher reflectivity value indicates a smoother copper surface.

FIG. 5 indicates plated copper thickness versus reflectivity in the case of no pre-treatment. Curve 510 indicates the result of copper plating using no pre-treatment and an electroplating bath having 2 ml/L of accelerator. In general, 2 ml/L is approximately 20 ppm. This condition results in a minimum reflectivity (maximum roughness) at approximately 1200 Å and the roughest copper surface of all three conditions indicated on FIG. 5. Curve 515 indicates that increasing the accelerator concentration in the electroplating bath to 2 ml/L decreases the overall roughness and decreases the thickness at which the maximum roughness occurs to approximately 800 Å. Curve 520 indicates that there is a small benefit to increasing the accelerator concentration to 10 ml/L.

The scenarios depicted by curves 610, 620 and 630 of FIG. 6 all involved copper electroplating using no accelerator in the electroplating bath. Curve 610 illustrates the condition of no pre-treatment combined with no accelerator in the bath: the copper becomes progressively rougher as the thickness increases. Curve 620 indicates the dramatically improved results of pre-treating the copper seed layer with only 2 ml/L of accelerator. As shown by curve 630, increasing the pre-treatment concentration by a factor of 10 provided some additional benefits.

The scenarios depicted by curves 710 and 720 FIG. 7 both involved copper electroplating using 2 ml/L of accelerator in the electroplating bath. Curve 710 illustrates the condition of no pre-treatment combined with 2 ml/L of accelerator in the bath. As shown by curve 720, a substantial improvement is realized by pre-treating the copper seed layer, in this example by using an accelerator concentration of 20 ml/L.

In some implementations, step 430 of FIG. 4 involves a process of electroplating metal that is described in U.S. patent application Ser. No. 09/796,856, (the "prior application"), which is hereby incorporated by reference in its entirety. The prior application defined four phases of the electrofilling process and disclosed controlled current density methods for each phase for optimal filling of small embedded features.

Figure 8:
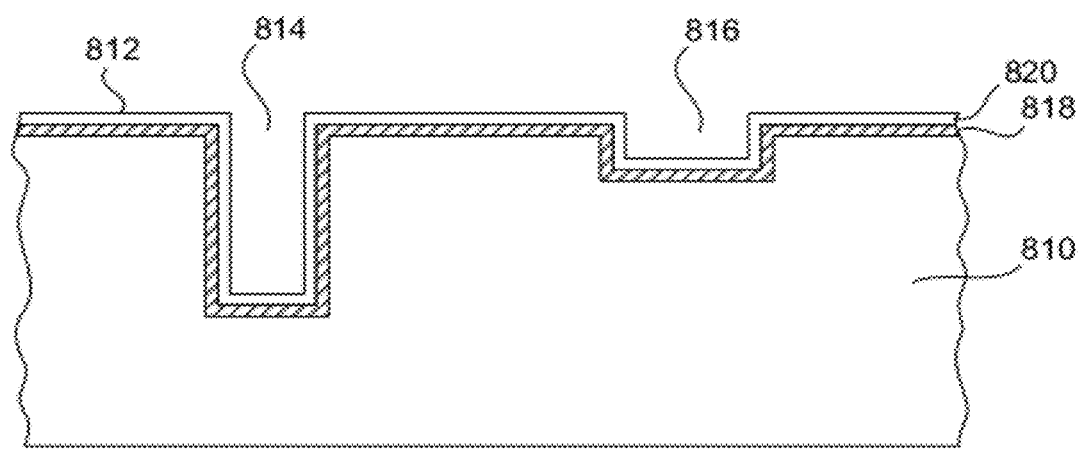
FIG. 8 is a cross sectional diagram of a portion of a semiconductor device.

A cross section of a patterned multilayer wafer 810, on which metal is to be electroplated, is illustrated in FIG. 8. In general, wafer 810 represents several layers of semiconductor material, dielectric material, and other metallic layers. The surface of wafer 810 includes a flat field region 812 and features such as trenches or vias with a range of aspect ratios (AR), defined as the ratio of depth to width. For example, large AR feature 814 and small AR feature 816 are included in the surface of wafer 810. A seed layer 818, typically deposited by a PVD or CVD process, overlies the surface of wafer 810. The seed layer may be non-uniform and may exhibit islands, that is, the seed layer may not completely cover the surface of all the features of wafer 810.

In the first phase, or "entry phase", a patterned, multilayered substrate such as wafer 810, having a seed layer 818 of the metal to be plated, is immersed into an electroplating bath. The methods of the prior application avoid etching or corrosion of the seed layers within trenches or vias of the patterned substrate during the entry step.

The seed layer may be cathodically polarized by applying a DC cathodic current density of between about 0.02 and about 10 milliamperes per square centimeter, preferably prior to (or less than approximately 5 seconds after) immersion in the bath. Cathodic current pulses (or alternating cathodic and anodic current pulses) may be superimposed on the DC cathodic current density. For example, the current pulses may have current densities of between about 25 and about 250 milliamperes per square centimeter and pulse lengths of between about 0.5 and about 10 milliseconds.

The second phase, the "initiation phase," involves the nucleation and island bridging of the seed layer resulting in growth of a conformal initial film 820 everywhere on the surface of the substrate including the recessed regions such as large AR feature 814 and small AR feature 816. The conformal film has sufficient conductivity to facilitate subsequent electrofilling. The third phase, "bottom-up filling phase" involves the preferential deposition of metal on the bottom of high aspect ratio features having AR's greater than about 0.5, leading to bottom-up filling and reduction of the AR's. The final phase, "low aspect ratio filling phase" pertains to the filling of low AR features and plating the field region, in a rapid, substantially conformal manner, until the required metal thickness is achieved.

During the second phase, the current density may be increased to, e.g., between about 5 and about 15 milliamperes per square centimeter. During the third phase, the current density may be further increased to, e.g., to a current density of between about 4 and about 45 milliamperes per square centimeter over a period of between about 3 and about 60 seconds. The final phase may involve increasing the current density to, e.g., a value between about 15 and about 75 milliamperes per square centimeter.

The electroplating bath of the prior application contained specified additives, together with controlled current density methods for each phase, for providing an electroplating method that avoids defects in the plated films while retaining the advantages of good filling and thickness distribution described in the prior application. The electroplating bath contains positive ions of the metal to be plated and the associated anions in an acid solution. Copper electroplating is typically performed from a solution of $CuSO_4$ dissolved in an aqueous solution of sulfuric acid. In addition, the electroplating bath contains ppm levels of chloride ions and several additives, classified as accelerators, suppressors, and levelers. Accelerators have been described above. In some implementations, the electroplating solution contains accelerator in a concentration in the range from approximately 0 milliliters per liter to 4 milliliters per liter.

Suppressors are polymers that absorb at a copper surface and decrease the local current density at a given applied voltage, thus retarding plating. Suppressors are added to plating solutions at relatively high concentrations, on the order of from 100 to 2000 mg/L and form uniform adsorbed films at the copper surface that are not strongly dependent on local mass transfer effects. Suppressors are generally derived from polyethylene glycol (PEG), polypropylene glycol (PPG), polyethylene oxide, or their derivatives or co-polymers. Commercial suppressors include Ultrafill S-2001 from Shipley and S200 from Enthone OMI.

The effect of levelers is more complicated than the effects of the other additives and depends on local mass transfer behavior. Levelers are typically cationic surfactants and dyes that suppress current at locations where their mass transfer rate is most rapid. The presence of levelers, therefore, in the plating bath serves to reduce the film growth rate at protruding surfaces or corners where the levelers are preferentially absorbed. Levelers are added to the plating bath at low enough concentrations, usually between about 1 and about 30 mg/L, that absorption differences due to differential mass transfer effects have a significant effect. The differential mass transfer rates of levelers at different locations are a result of differences in diffusion rates to different geometrical locations and of higher electrostatic migration rates to points on the surface at a more negative voltage. To take advantage of the second effect, most levelers are cationic and usually contain protonated nitrogen-based functional groups. Dodecyltrimethylammonium bromide (DTAB) is a leveler of the tetraalkylammonium class. DTAB is cationic in acidic solution and migrates and diffuses to protrusions on a wafer surface. Other specific levelers have been described, for example, in the '196 patent and references therein, in U.S. Pat. Nos. 4,555,135 and 3,956,120, incorporated herein by reference, and in the papers of Kelly et al. (J. Electrochem. Soc. 126, 2540 (1999) and of Mirkova et al. (Surface Technology 15, 181 (1982.) Levelers are available commercially as Liberty or Ultrafill Leveler from Shipley and Booster 3 from Enthone OMI. While the use of levelers has been described previously, the present inventors have discovered the unexpected beneficial effects of avoiding copper film defects, yielding much more specular plated wafer surfaces, when electroplating baths including levelers are used with specific electroplating processes. The inclusion of appropriate concentrations of additives in the electroplating bath has a different and useful effect at each of the four phases of the electroplating process.

Additional implementations of the above invention involve pre-treatment of the wafer with accelerator, as described above, followed by electroplating in a bath containing higher concentration of leveler molecules than used in nominal baths. For example, some such implementations use an electroplating bath having a leveler concentration in the range of approximately 1 to 7 ppm, although higher or lower concentrations may be used. A limitation with current state of the art additive formulations of accelerator, suppressor, and leveler is that the leveler concentration must be low enough to allow for bottom-up fill to take place while being high enough to provide sufficient leveling. For sub-100 nanometer device structures, a trade-off between fill effectiveness and leveling is required. The present invention of pre-treating the wafer with accelerator allows for a high rate of bottom-up fill and reduced void formation during the initial stages of plating. With accelerator pre-treatment, there is less initial competitive adsorption between accelerator and leveler as the accelerator is already present on the wafer surface. Therefore, the leveler concentration can be increased in the bath to provide a high degree of leveling without impacting bottom-up fill.

Figure 9:
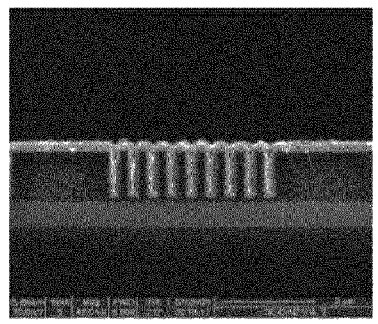
FIG. 9 provides scanning electron microscope images of cleaved trenches showing various filling behavior with and without accelerator pre-treatment.
Figure 9:
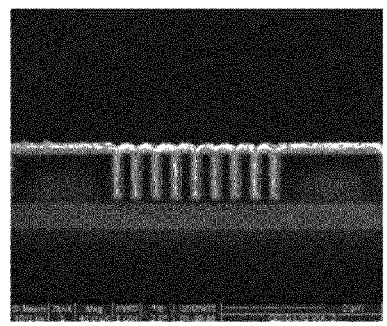
Figure 9:
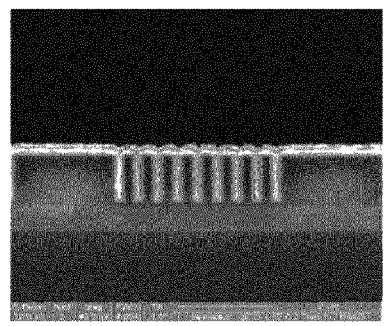

FIG. 9 shows trench fill behavior under conditions of with and without accelerator pre-treatment. Wafers plated under bath conditions that have a low rate of bottom-up fill, in particular with a low concentration of accelerator or a excessive amount of leveler, and without accelerator pre-treatment clearly show voids. However, wafers plated following accelerator pre-treatment in a low accelerating bath or high leveling bath show complete trench fill.

Other Embodiments

Although illustrative embodiments and applications of this invention are shown and described herein, many variations and modifications are possible which remain within the concept, scope, and spirit of the invention, and these variations would become clear to those of ordinary skill in the art after perusal of this application. Moreover, while the invention has been described primarily in terms of preparing integrated circuits, it is not so limited.

Accordingly, the present embodiments are to be considered as illustrative and not restrictive, and the invention is not to be limited to the details given herein, but may be modified within the scope and equivalents of the appended claims.

We claim:

1. A method comprising:
   providing a substrate having a copper seed layer;
   spraying the copper seed layer with a pretreatment solution including an accelerator additive; and
   depositing copper on the copper seed layer in a plating solution including substantially no accelerator additive.

2. The method of claim 1, wherein the accelerator additive of the pretreatment solution includes mercaptopropanesulfonic acid.

3. The method of claim 1, wherein the accelerator additive of the pretreatment solution is selected from the group consisting of: organic sulfur compounds in different thiol forms having the structure of X—S—S—C—C—C—SO3-; a derivative of mercaptopropanesulfonic acid; bis(3-sulfopropyl)disulfide; 3-mercapto-propanesulphonic acid; bis(3-sulfoethyl)disulfide; 3-(benzothiazolyl-2-mercapto)-propylsulfonic acid; and N,N-dimethyl-dithiocarbamylpropyl sulfonic acid.

4. The method of claim 1, wherein a pH of the pretreatment solution is within a range of 4 to 8.

5. The method of claim 1, wherein the substrate includes a via.

6. The method of claim 1, wherein the plating solution includes a leveler additive.

7. The method of claim 1, wherein the leveler additive is selected from the group consisting of: a cationic compound including protonated nitrogen-based functional groups; dodecyltrimethylammonium bromide; and a leveler of the tetraalkylammonium class.

8. A method comprising:

providing a substrate having a surface having a copper seed layer;

spraying the copper seed layer with a pretreatment solution including an accelerator additive;

applying a DC cathodic current density through the surface to cathodically polarize the copper seed layer with respect to an electroplating solution, the electroplating solution including substantially no accelerator additive; and immersing the surface in the electroplating solution.

9. The method of claim 8, wherein the DC cathodic current density is applied prior to or less than approximately 5 seconds following the immersing the surface in the electroplating solution.

10. The method of claim 8, wherein DC cathodic current density is between about 0.02 and about 10 milliamperes per square centimeter.

11. The method of claim 8, wherein the DC cathodic current density includes cathodic current pulses superimposed on the DC cathodic current density.

12. The method of claim 11, wherein the cathodic current pulses have a current density between about 25 and about 250 milliamperes per square centimeter.

13. The method of claim 11, wherein the cathodic current pulses have a pulse length between about 0.5 and about 10 milliseconds.

14. The method of claim 8, wherein the DC cathodic current density includes alternating cathodic current pulses and anodic current pulses superimposed on the DC cathodic current density.

15. A method comprising:

providing a substrate having a surface including a field region and a plurality of recessed features, the surface having a copper seed layer;

spraying the surface with a pretreatment solution including an accelerator additive;

immersing the surface in an electroplating solution including copper ions, a leveler additive, and substantially no accelerator additive; and applying a first DC cathodic current density through the surface, the first DC cathodic current density being sufficiently small such that depletion of the copper ions and the leveler additive is absent at the field region and at the plurality of recessed features.

16. The method of claim 15, further comprising applying a second DC cathodic current density through the surface, the second DC cathodic current density being at a level such that deposition of copper occurs preferentially on bottoms of the recessed features having the largest aspect ratios;

increasing the second DC cathodic current density until the plurality of recessed features have aspect ratios less than about 0.5; and further increasing the current density to a level of DC cathodic current density that fills the plurality of recessed features with copper and deposits copper onto the field region.

17. The method of claim 15, wherein the accelerator additive of the pretreatment solution includes mercaptopropanesulfonic acid.

18. The method of claim 15, wherein the accelerator additive of the pretreatment solution is selected from the group consisting of: organic sulfur compounds in different thiol forms having the structure of X—S—S—C—C—C—SO3-; a derivative of mercaptopropanesulfonic acid; bis(3-sulfopropyl)disulfide; 3-mercapto-propanesulphonic acid; bis(3-sulfoethyl)disulfide; 3-(benzothiazolyl-2-mercapto)-propylsulfonic acid; and N,N-dimethyl-dithiocarbamylpropyl sulfonic acid.

19. The method of claim 15, wherein the leveler additive is at a concentration in a range from 1 ppm to 7 ppm.

20. The method of claim 15, wherein the leveler additive is selected from the group consisting of: a cationic compound including protonated nitrogen-based functional groups; dodecyltrimethylammonium bromide; and a leveler of the tetraalkylammonium class.

* * * * *